US009373560B2

(12) United States Patent
Uchida

(10) Patent No.: US 9,373,560 B2
(45) Date of Patent: Jun. 21, 2016

(54) DRIVE CIRCUIT DEVICE

(71) Applicant: JTEKT CORPORATION, Osaka-shi, Osaka (JP)

(72) Inventor: Nobuhiro Uchida, Yamatotakada (JP)

(73) Assignee: JTEKT CORPORATION, Osaka-shi (JP)

( * ) Notice: Subject to any disclaimer, the term of this patent is extended or adjusted under 35 U.S.C. 154(b) by 174 days.

(21) Appl. No.: 14/195,975

(22) Filed: Mar. 4, 2014

(65) Prior Publication Data

US 2014/0254105 A1  Sep. 11, 2014

(30) Foreign Application Priority Data

Mar. 11, 2013  (JP) ................................ 2013-047828

(51) Int. Cl.
*H05K 7/20* (2006.01)
*H01L 23/367* (2006.01)
*H02M 7/00* (2006.01)
*H05K 1/02* (2006.01)

(52) U.S. Cl.
CPC ............. *H01L 23/367* (2013.01); *H02M 7/003* (2013.01); *H05K 1/0263* (2013.01); *H01L 23/3675* (2013.01); *H01L 2924/0002* (2013.01); *H05K 1/0203* (2013.01); *H05K 2201/10166* (2013.01)

(58) Field of Classification Search
CPC . H02M 7/003; H01L 23/367; H01L 23/3675; H01L 2924/00; H01L 2924/0002; H05K 1/0263; H05K 1/0203; H05K 2201/10166
See application file for complete search history.

(56) References Cited

U.S. PATENT DOCUMENTS

| 5,982,031 | A | * | 11/1999 | Stockmeier | ........... | H01L 25/115 257/500 |
| 7,327,024 | B2 | * | 2/2008 | Stevanovic | ........... | H01L 25/072 257/691 |
| 8,288,658 | B2 | * | 10/2012 | Uchida | ................ | B62D 5/0406 174/252 |
| 2012/0014069 | A1 | * | 1/2012 | Zeng | ................... | H01L 23/4334 361/718 |
| 2012/0106220 | A1 | | 5/2012 | Yamaguchi et al. | | |

FOREIGN PATENT DOCUMENTS

| DE | 10 2008 040 906 A1 | 2/2010 |
| EP | 2 066 158 A2 | 6/2009 |
| JP | A-2009-277726 | 11/2009 |

OTHER PUBLICATIONS

Jun. 18, 2014 Extended European Search Report issued in European Patent Application No. 14158022.5.

* cited by examiner

*Primary Examiner* — Matthew Nguyen
(74) *Attorney, Agent, or Firm* — Oliff PLC

(57) ABSTRACT

A drive circuit device includes a circuit board having a multilayer structure, which includes first to fourth circuit conductor layers, and first to third insulating layers; and heat sinks that dissipate heat of the circuit board to an outside. An upper FET state is embedded in the first insulating layer, and a lower FET state is embedded in the second insulating layer. The upper FET and the lower FET are disposed so that a region in which the upper FET is positioned and a region in which the lower FET is positioned overlap each other in a stacking direction. A lead-out portion is formed at a second circuit pattern of the circuit conductor layer, the lead-out portion extending from the circuit board in a direction orthogonal to the stacking direction, and being connected to the heat sinks so that heat is transferred to the heat sinks.

6 Claims, 3 Drawing Sheets

DRIVE CIRCUIT DEVICE

INCORPORATION BY REFERENCE

The disclosure of Japanese Patent Application No. 2013-047828 filed on Mar. 11, 2013 including the specification, drawings and abstract, is incorporated herein by reference in its entirety.

BACKGROUND OF THE INVENTION

1. Field of the Invention

The present invention relates to a drive circuit device.

2. Description of Related Art

In general, a drive circuit (inverter), which includes switching arms connected in parallel, is used to supply driving electric power to an electric motor. Each of the switching arms includes switching elements such as FETs connected in series. As a conventional drive circuit device (motor control device) including the drive circuit, a drive circuit device, which is made small by using a circuit board having a multilayer structure, is known. In the circuit board having the multilayer structure, multiple circuit conductor layers, on which circuit patterns are formed, are stacked with insulating layers being interposed between the circuit conductor layers. For example, see Japanese Patent Application Publication No. 2009-277726.

Since a large drive current for driving the electric motor flows in the drive circuit, the amount of heat generated in the drive circuit is increased, and thus, the drive circuit is likely to be overheated. In the drive circuit device described in Japanese Patent Application Publication No. 2009-277726, switching elements are mounted on one surface of the circuit board and a heat-dissipating unit such as a heat sink is connected to the other surface of the circuit board so that heat is transferred to the heat sink. Accordingly, heat generated in the drive circuit (switching elements) is dissipated efficiently, and thus, the overheat of the drive circuit is prevented.

In recent years, the further reduction of the size of the drive circuit device has been required. However, since a mounting area needs to be secured on the circuit board in the structure in which the switching elements are mounted on one surface of the circuit board as described in Japanese Patent Application Publication No. 2009-277726, there is a limit on the reduction of the size of the drive circuit. Therefore, there has been a demand for development of a new technology that can make the drive circuit device smaller.

SUMMARY OF THE INVENTION

An object of the invention is to provide a small-sized drive circuit device.

A drive circuit device according to an aspect of the invention includes a circuit board in which a drive circuit is formed, the drive circuit including a plurality of switching arms connected in parallel, and each of the switching arms including a first switching element and a second switching element that are connected in series; and a heat-dissipating unit that dissipates heat of the circuit board to an outside, wherein the circuit board is a board having a multilayer structure in which multiple circuit conductor layers are stacked with insulating layers being interposed between the circuit conductor layers, the circuit conductor layers including circuit patterns made of a conductive material, wherein the first switching elements and the second switching elements are provided in the circuit board so that the circuit conductor layer is interposed between the first switching elements and the second switching elements, and a region in which the first switching elements are positioned and a region in which the second switching elements are positioned overlap each other in a stacking direction, and wherein a lead-out portion is formed at the circuit pattern of the circuit conductor layer interposed between the first switching elements and the second switching elements, the lead-out portion extending from the circuit board in a direction orthogonal to the stacking direction, and being connected to the heat-dissipating unit so that heat is transferred to the heat-dissipating unit.

With the structure according to the above-mentioned aspect, the region in which the first switching elements are positioned and the region in which the second switching elements are positioned overlap each other in the stacking direction, and therefore, it is possible to reduce the size of the circuit board, as compared to a case where the first and second switching elements are mounted on one side surface of the circuit board.

In the above-mentioned structure, in the circuit board, there are portions sandwiched from both sides in the stacking direction between the first switching elements and the second switching elements. Since both heat generated by the first switching elements and heat generated by the second switching elements are transferred to the portions, heat is likely to be accumulated at the portions. In the above-mentioned structure, the lead-out portion is formed at the circuit pattern of the circuit conductor layer interposed between the first switching elements and the second switching elements, the lead-out portion extending to an area outside the circuit board, and being connected to the heat-dissipating unit so that heat is transferred to the heat-dissipating unit. Therefore, it is possible to efficiently dissipate heat of the portions that are sandwiched from both sides in the stacking direction between the first switching elements and the second switching elements, through the lead-out portion of the circuit pattern. Thus, it is possible to reduce the size of the circuit board, while realizing high heat dissipation performance.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
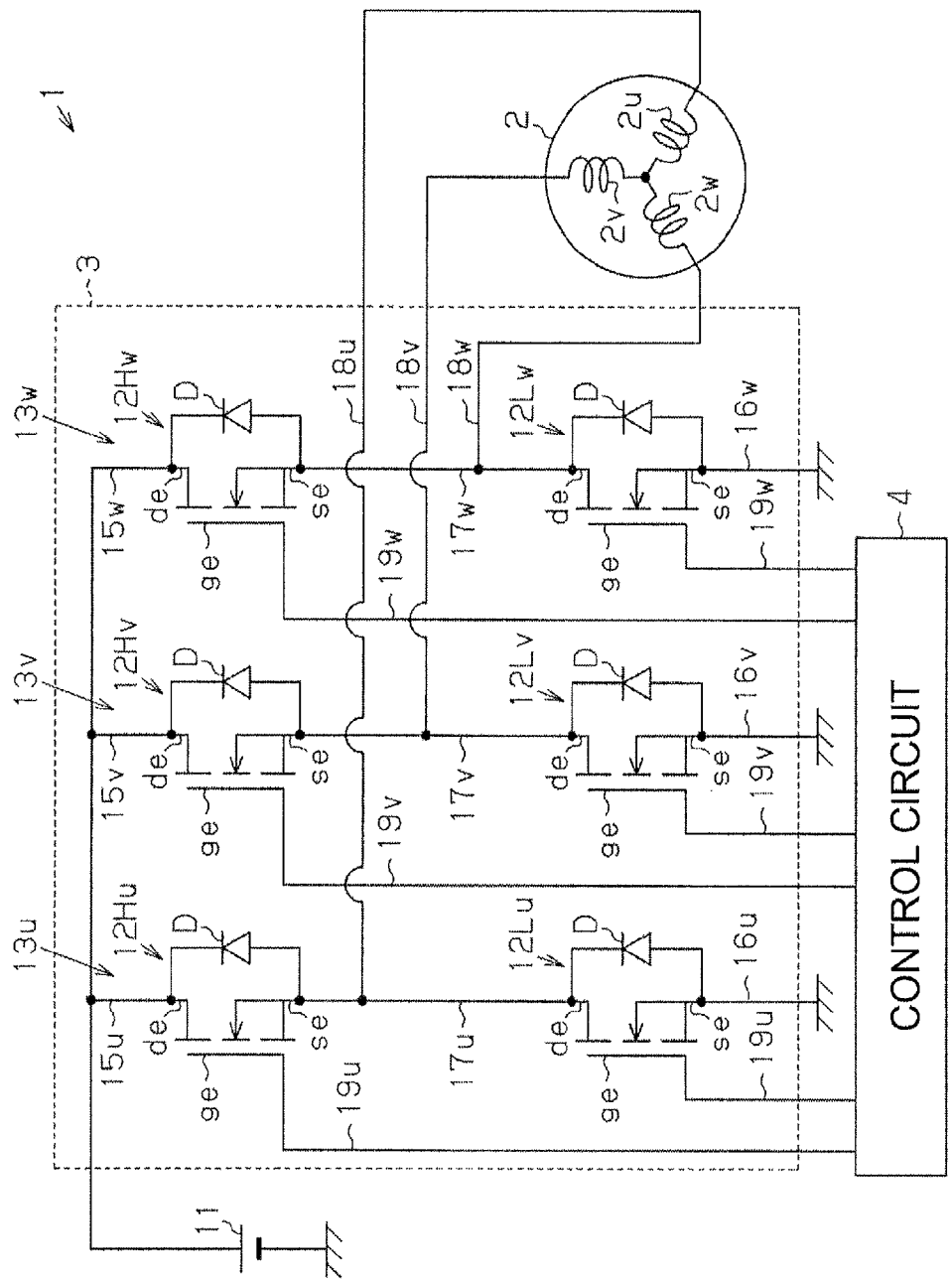
FIG. 1 is a block diagram schematically illustrating a drive circuit device.

An embodiment of the invention will be described below with reference to the drawings. A drive circuit device 1 shown in FIG. 1 supplies driving electric power to an electric motor 2 used as a drive source of an electric power steering system that applies an assist force to a steering system. As shown in FIG. 1, the drive circuit device 1 includes a drive circuit 3 that supplies driving electric power to the electric motor 2 and a control circuit 4 that controls the operation of the drive circuit 3. The drive circuit device 1 according to this embodiment is formed as a motor control device (an electronic control unit (ECU)). A three-phase (a U phase, a V phase, and a W phase) brushless motor is employed as the electric motor 2 of this embodiment.

The drive circuit 3 includes upper field-effect transistors (FETs) 12Hu, 12Hv, 12Hw that are connected to an in-vehicle power source (battery) 11, and lower FETs 12Lu, 12Lv, 12Lw that are connected to the ground. The upper FETs 12Hu, 12Hv, 12Hw serve as first switching elements, and the lower FETs 12Lu, 12Lv, 12Lw serve as second switching elements. The drive circuit 3 is formed by connecting, in parallel, a switching arm 13u including the upper FET 12Hu and the lower FET 12Lu that are connected in series, a switching arm 13v including the upper FET 12Hv and the lower FET 12Lv that are connected in series, and a switching arm 13w including the upper FET 12Hw and the lower FET 12Lw that are connected in series. That is, the drive circuit 3 is formed as a known pulse width modulation (PWM) inverter in which three switching arms 13u, 13v, 13w corresponding to motor coils 2u, 2v, 2w for the respective phases of the electric motor 2 are connected in parallel.

More specifically, drain electrodes de of the upper FETs 12Hu, 12Hv, 12Hw are connected to the in-vehicle power source 11 through power source (drain) lines 15u, 15v, 15w, respectively. Source electrodes se of the lower FETs 12Lu, 12Lv, 12Lw are connected to the ground through ground (source) lines 16u, 16v, 16w, respectively. Source electrodes se of the upper FETs 12Hu, 12Hv, 12Hw are connected to drain electrodes de of the lower FETs 12Lu, 12Lv, 12Lw through serial lines 17u, 17v, 17w, respectively. The serial lines 17u, 17v, 17w are connected to the motor coils 2u, 2v, 2w for the respective phases through power lines 18u, 18v, 18w, respectively. Each of the upper FETs 12Hu, 1211v, 1211w and the lower FETs 12Lu, 12Lv, 12Lw is provided with a parasitic diode D that allows a current to flow toward the drain electrode de side from the source electrode se side.

The control circuit 4 is connected to gate electrodes ge of the upper FETs 12Hu, 1211v, 1211w and the lower FETs 12Lu, 12Lv, 12Lw through signal (gate) lines 19u, 19v, 19w. A motor control signal is output to each of the gate electrodes ge, whereby the ON/OFF of each of the upper FETs 1211u, 1211v, 12Hw and the lower FETs 12Lu, 12Lv, 12Lw is controlled. That is, the motor control signal is a gate ON/OFF signal that defines the switching state of each of the upper FETs 12Hu, 12Hv, 1211w and the lower FETs 12Lu, 12Lv, 12Lw. Although not shown in the drawings, steering torque, vehicle speed, and the rotation angle of the electric motor 2 are input to the control circuit 4 of this embodiment. Accordingly, the control circuit 4 controls the operation of the electric motor 2 by outputting motor control signals based on these state quantities.

In the drive circuit device 1 that is formed in this manner, the upper FETs 12Hu, 12Hv, 1211w and the lower FETs 12Lu, 12Lv, 12Lw are turned on or off in response to the motor control signals, and accordingly, a current-supply pattern for the motor coils 2u, 2v, 2w for the respective phases is changed. Thus, a power supply voltage of the in-vehicle power source 11 is converted to three-phase driving electric power and the three-phase driving electric power is output to the electric motor 2.

The structure of a circuit board 21 on which the drive circuit 3 is formed will be described. Since the sectional structures of portions near the switching arms 13u, 13v, 13w in the drive circuit device 1 are the same, the structure of the switching arm 13u for a U phase will be described and the description of the switching arms 13v, 13w for a V phase and a W phase will be omitted for convenience of description.

Figure 2:
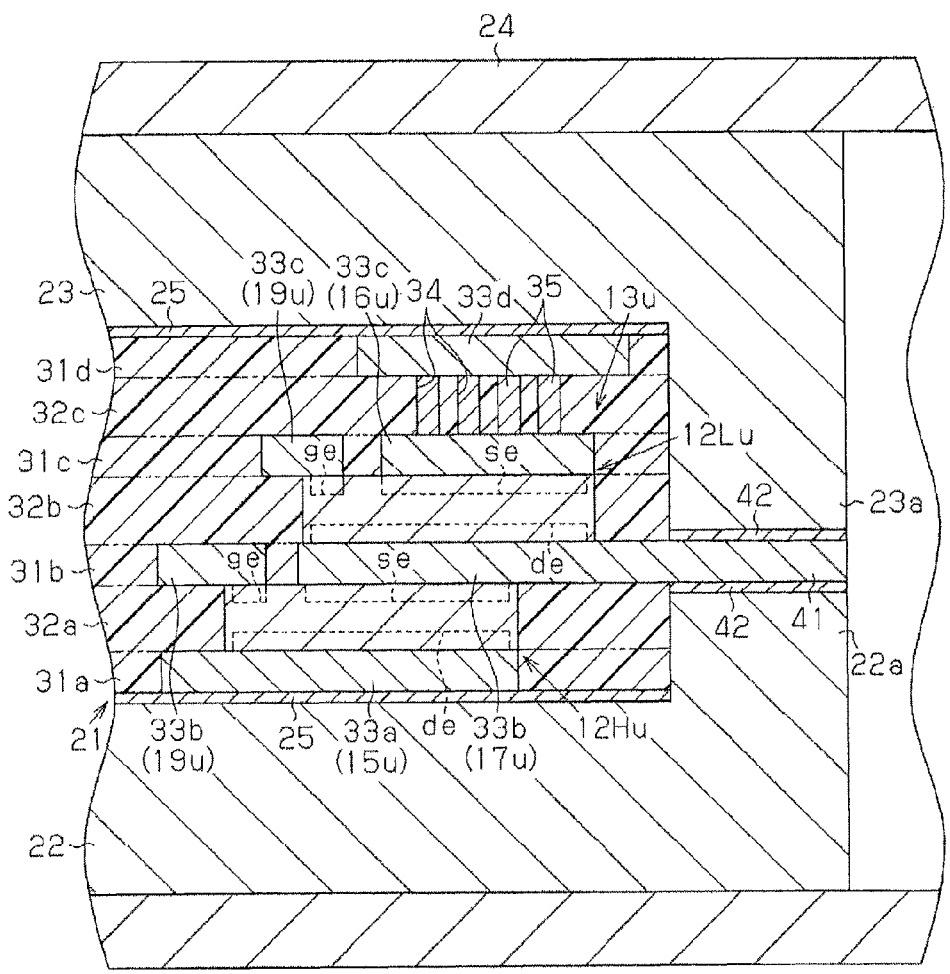
FIG. 2 is a partial sectional view illustrating a drive circuit device according to an embodiment.

As shown in FIG. 2, a board having a multilayer structure, in which multiple circuit conductor layers are stacked with insulating layers being interposed between the circuit conductor layers, is used as the circuit board 21. Heat sinks 22, 23 as heat-dissipating units are connected to respective side surfaces of the circuit board 21 in a stacking direction (a top-bottom direction in FIG. 2) so that heat is transferred to the heat sinks 22, 23, and the circuit board 21 in this state is housed in a case 24 of the drive circuit device 1.

More specifically, the case 24 is formed in the shape of a quadrangular box. Each of the heat sinks 22, 23 is formed in the shape of a flat plate, and is fixed to the inner surface of the case 24. Each of the case 24 and the heat sinks 22, 23 is made of a material having high heat conductivity, such as an aluminum alloy.

The circuit board 21 includes a first circuit conductor layer 31a, a second circuit conductor layer 31b, a third circuit conductor layer 31c, and a fourth circuit conductor layer 31d, and a first insulating layer 32a, a second insulating layer 32b, and a third insulating layer 32c that are interposed between these circuit conductor layers. In this embodiment, the first circuit conductor layer 31a, the first insulating layer 32a, the second circuit conductor layer 31b, the second insulating layer 32b, the third circuit conductor layer 31c, the third insulating layer 32c, and the fourth circuit conductor layer 31d are stacked in this order from the heat sink 22 side (the lower side in FIG. 2). Further, a sheet-shaped insulating member 25 is interposed between the first circuit conductor layer 31a and the heat sink 22 and another sheet-shaped insulating member 25 is interposed between the fourth circuit conductor layer 31d and the heat sink 23. The insulating member 25 of this embodiment is made of an insulating material having high heat conductivity, such as ceramics.

The first circuit conductor layer 31a, the second circuit conductor layer 31b, the third circuit conductor layer 31c, and the fourth circuit conductor layer 31d include a first circuit pattern 33a, a second circuit pattern 33b, a third circuit pattern 33c, and a fourth circuit pattern 33d, respectively. Each of the first circuit pattern 33a, the second circuit pattern 33b, the third circuit pattern 33c, and the fourth circuit pattern 33d is formed by removing a part of conductive foil made of a conductive material such as copper foil. Gaps between lines forming the first circuit pattern 33a, the second circuit pattern 33b, the third circuit pattern 33c, and the fourth circuit pattern 33d are filled with an insulating resin material. The power source line 15u is included in the first circuit pattern 33a, the serial line 17u and the signal line 19u are included in the second circuit pattern 33b, and the ground line 16u and the signal line 19u are included in the third circuit pattern 33c.

The first insulating layer 32a, the second insulating layer 32b, and the third insulating layer 32c are made of an insulating resin material, and thus, the first circuit pattern 33a, the second circuit pattern 33b, the third circuit pattern 33c, and the fourth circuit pattern 33d are insulated from each other. Further, via holes (interlayer connection holes) 34, which extend through a predetermined circuit conductor layer and a predetermined insulating layer and extend in the stacking direction, are formed in the circuit board 21. Interlayer connection members 35, which are made of a conductor material such as copper, are inserted into the inner peripheries defining the via holes 34, and the circuit patterns of the different layers are electrically connected to each other through the interlayer connection members 35.

The upper FET 12Hu in a bare chip state is embedded in the first insulating layer 32a, and the lower FET 12Lu in a bare chip state is embedded in the second insulating layer 32b. That is, the second circuit conductor layer 31b is interposed between the upper FET 12Hu and the lower FET 12Lu. The upper FET 12Hu and the lower FET 12Lu are disposed so that a region in which the upper FET 12Hu is positioned and a region in which the lower FET 12Lu is positioned overlap each other in the stacking direction.

The drain electrode de of the upper FET 12Hu is electrically connected to the power source line 15u of the first circuit pattern 33a, the source electrode se thereof is electrically connected to the serial line 17u of the second circuit pattern 33b, and the gate electrode ge thereof is electrically connected to the signal line 19u of the second circuit pattern 33b. The drain electrode de of the lower FET 12Lu is electrically connected to the serial line 17u of the second circuit pattern 33b, the source electrode se thereof is electrically connected to the ground line 16u of the third circuit pattern 33c, and the gate electrode ge thereof is electrically connected to the signal line 19u of the third circuit pattern 33c. Accordingly, the switching arm 13u in which the upper FET 12Hu and the lower FET 12Lu are connected in series is formed.

In this embodiment, the second circuit conductor layer 31b is sandwiched from both sides in the stacking direction between the upper FET 12Hu and the lower FET 12Lu as described above. Accordingly, since both heat generated by the upper FET 1211u and heat generated by the lower FET 12Lu are transferred to a portion of the second circuit conductor layer 31b, which is sandwiched between the upper FET 12Hu and the lower FET 12Lu, heat is likely to be accumulated at the above-mentioned portion of the second circuit conductor layer.

A lead-out portion 41, which is continuous with the serial line 17u, extends in an orthogonal direction orthogonal to the stacking direction (a horizontal direction in FIG. 2), and extends to an area outside the circuit board 21, is formed at the second circuit pattern 33b to cope with the accumulation of heat. An extension portion 22a is formed at the heat sink 22 and an extension portion 23a is formed at the heat sink 23. Each of the extension portions 22a, 23a extends toward the lead-out portion 41-side in the stacking direction, from a portion protruding in the orthogonal direction beyond an edge portion of the circuit board 21. The lead-out portion 41 is connected to both the extension portions 22a, 23a with sheet-shaped insulating members 42 interposed therebetween so that heat is transferred to the extension portions 22a, 23a.

In the manufacture of the circuit board 21, first, a part of conductive foil formed on each side of an insulating layer, which is to serve as one of the first insulating layer 32a, the second insulating layer 32b, and the third insulating layer 32c, is removed by etching or the like to form one of the first circuit pattern 33a, the second circuit pattern 33b, the third circuit pattern 33c, and the fourth circuit pattern 33d. Subsequently, a step of appropriately connecting the upper FETs 12Hu, 12Hv, 1211w and the lower FETs 12Lu, 12Lv, 12Lw to the circuit pattern, stacking new conductive foil so that an insulating resin material forming an insulating layer is interposed between the circuit pattern and the conductive foil, and forming a circuit pattern on the conductive foil is repeated. Then, the via holes 34 are formed and the interlayer connection members 35 are provided in the inner peripheries defining the via holes 34, and thus, the circuit board 21 is manufactured.

The action of this embodiment will be described. When driving electric power is supplied to the electric motor 2, each of the upper FETs 12Hu, 12Hv, 12Hw and the lower FETs 12Lu, 12Lv, 12Lw generates heat. At this time, heat generated by the upper FETs 12Hu, 12Hv, 12Hw is dissipated by being transferred to the heat sink 22 through the first circuit conductor layer 31a, and is dissipated by being transferred to the extension portions 22a, 23a of the heat sinks 22, 23 through the lead-out portion 41 of the second circuit conductor layer 31b. On the other hand, heat generated by the lower FETs 12Lu, 12Lv, 12Lw is dissipated by being transferred to the heat sink 23 through the third circuit conductor layer 31c, the third insulating layer 32c, the interlayer connection members 35, and the fourth circuit conductor layer 31d, and is dissipated by being transferred to the extension portions 22a, 23a of the heat sinks 22, 23 through the lead-out portion 41 of the second circuit conductor layer 31b. Accordingly, the heat of the entire circuit board 21 is efficiently dissipated.

Next, the effects of this embodiment will be described. Since the regions in which the upper FETs 12Hu, 12Hv, 12Hw are positioned and the regions in which the lower FETs 12Lu, 12Lv, 12Lw are positioned overlap each other in the stacking direction, the area of the circuit board 21 can be reduced. Further, since the lead-out portion 41 is formed at the second circuit pattern 33b and is connected to the extension portions 22a, 23a of the heat sinks 22, 23 so that heat is transferred to the extension portions 22a, 23a, heat of the portions of the second circuit conductor layer 31b, which are sandwiched from both sides in the stacking direction between the upper FETs 12Hu, 12Hv, 12Hw and the lower FETs 12Lu, 12Lv, 12Lw, can be efficiently dissipated through the lead-out portion 41. Accordingly, it is possible to reduce the size of the circuit board 21 while realizing high heat dissipation performance.

Each of the upper FETs 12Hu, 12Hv, 12Hw and the lower FETs 12Lu, 12Lv, 12Lw in the bare chip state is embedded in the circuit board 21, and the heat sinks 22, 23 are connected to the circuit board 21 from both sides in the stacking direction so that the circuit board 21 is sandwiched from both sides in the stacking direction between the heat sinks 22, 23 and heat is transferred to the heat sinks 22, 23. Thus, it is possible to efficiently dissipate heat toward areas on both sides of the circuit board 21 in the stacking direction through the heat sinks 22, 23, to realize higher heat dissipation performance, and to reduce the size of the circuit board 21.

The invention may be implemented in the following modified examples obtained by appropriately modifying the above-mentioned embodiment. The heat sinks 22, 23 are formed in the shape of a flat plate in the above-mentioned embodiment, but the invention is not limited thereto. For example, fins or the like may be formed on the side surface of each of the heat sinks 22, 23, the side surface being located on a side opposite to the circuit board 21-side. Further, flow passages through which a refrigerant, such as water or air, passes may be formed in the heat sinks 22, 23. Furthermore, the heat sinks 22, 23 may not be separately provided and the circuit board 21 may be fixed to the inner surface of the case 24 so that the case 24 functions as a heat-dissipating unit.

The lead-out portion 41 is connected to both the extension portions 22a, 23a so that heat is transferred to the extension portions 22a, 23a in the above-mentioned embodiment, but the invention is not limited thereto. The lead-out portion 41 may be connected to one of the extension portions 22a, 23a so that heat is transferred to the one of the extension portions 22a, 23a.

The numbers of the circuit conductor layers and the insulating layers, the connection between the layers, or the like may be appropriately changed in the above-mentioned embodiment. Specifically, an insulating layer and a circuit conductor layer, which is connected to the first circuit conductor layer 31a through the interlayer connection members 35 (the via holes 34), may be added between the first circuit conductor layer 31a and the heat sink 22. The third circuit conductor layer 31c, to which the lower FET 12Lu is connected, may be connected to the heat sink 23 with the insulating member 25 interposed therebetween so that heat is transferred to the heat sink 23. Further, multiple circuit conductor layers may be interposed between the upper FET 12Hu and the lower FET 12Lu.

Figure 3:
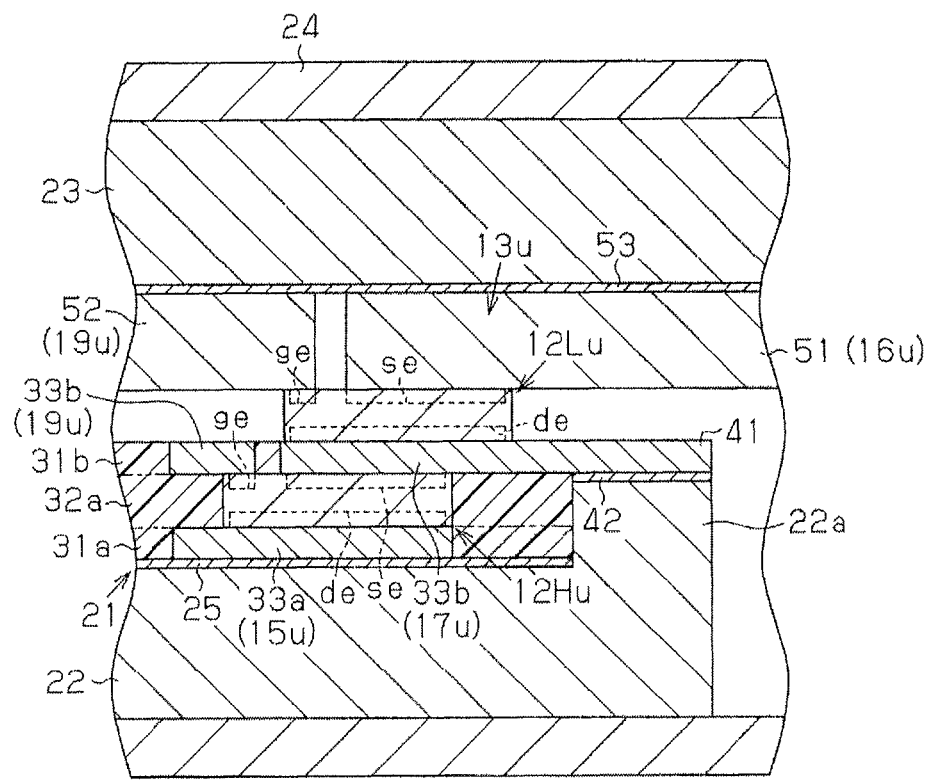
FIG. 3 is a partial sectional view illustrating a drive circuit device according to a modified example.

The upper FETs 12Hu, 12Hv, 12Hw and the lower FETs 12Lu, 12Lv, 12Lw are embedded in the circuit board 21 in the above-mentioned embodiment, but the invention is not limited thereto. The upper FETs 12Hu, 12Hv, 12Hw and the lower FETs 12Lu, 12Lv, 12Lw may be provided so as to be exposed to the outside. In an embodiment shown in FIG. 3, a lower FET 12Lu is provided so as to be exposed at the side surface of the circuit board 21, a bus bar 51 forming a ground line 16u is electrically connected to a source electrode se of the lower FET 12Lu, and a bus bar 52 forming a signal line 19u is electrically connected to a gate electrode ge of the lower FET 12Lu. In this case, it is preferable that a heat sink 23 be connected to the bus bars 51, 52 with an insulator 53 interposed therebetween so that heat is transferred to the bus bars 51, 52 as shown in FIG. 3.

Figure 4:
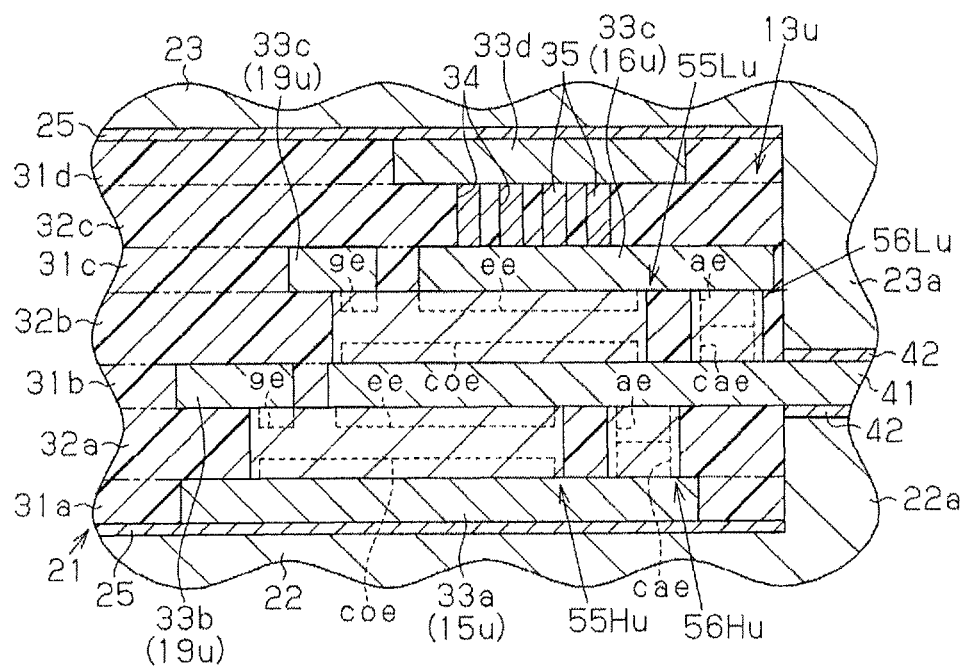
FIG. 4 is a partial sectional view illustrating a drive circuit device according to another modified example.

The drive circuit 3 is formed using FETs in the above-mentioned embodiment, but the invention is not limited thereto. For example, the drive circuit 3 may be formed using other switching elements such as insulated gate bipolar transistors (IGBTs). In the structure using IGBTs, the diodes are used in combination. Specifically, as shown in FIG. 4, a collector electrode coe of an upper IGBT 55Hu and a cathode electrode cae of an upper diode 56Hu are electrically connected to a power source line 15u of a first circuit pattern 33a. An emitter electrode ee of the upper IGBT 55Hu, an anode electrode ae of the upper diode 56Hu, and a collector electrode coe of a lower IGBT 55Lu, and a cathode electrode cae of a lower diode 56Lu are electrically connected to a serial line 17u of a second circuit pattern 33b. An emitter electrode ee of the lower IGBT 55Lu and an anode electrode ae of the lower diode 56Lu are electrically connected to a ground line 16u of a third circuit pattern 33c. A gate electrode ge of the upper IGBT 55Hu is connected to a signal line 19u of the second circuit pattern 33b, and a gate electrode ge of the lower IGBT 55Lu is connected to a signal line 19u of the third circuit pattern 33c.

An FET or the like in which a bare chip is sealed (packaged) with a sealant or the like may be used as the switching element in the above-mentioned embodiment. The drive circuit device 1 includes the control circuit in the above-mentioned embodiment, but the invention is not limited thereto. A control circuit device including a control circuit may be separately provided, and the drive circuit device 1 may not include a control circuit.

A brushless motor is used as the electric motor 2 in the above-mentioned embodiment, but the prevent invention is not limited thereto. For example, a DC motor with a brush may be used as the electric motor 2. In this case, the drive circuit 3 is formed as an H bridge circuit in which two switching arms are connected in parallel.

Driving electric power is supplied to the electric motor 2 that applies an assist force, by using the drive circuit device 1 in the above-mentioned embodiment, but the invention is not limited thereto. For example, driving electric power may be supplied to an electric motor used as a drive source of another device such as an electric pump device.

Next, the technical idea, which can be understood from the above-mentioned embodiment and modified examples, will be additionally described below together with the effects thereof. Each of the switching elements in the bare chip state is embedded in the circuit board. According to the above-mentioned structure, it is possible to make the circuit board smaller.

What is claimed is:

1. A drive circuit device comprising:
   a circuit board in which a drive circuit is formed, the drive circuit including a plurality of switching arms connected in parallel, and each of the switching arms including a first switching element and a second switching element that are connected in series; and
   a heat-dissipating unit that dissipates heat of the circuit board to an outside,
   wherein the circuit board is a board having a multilayer structure in which multiple circuit conductor layers are stacked with insulating layers being interposed between the circuit conductor layers, the circuit conductor layers including circuit patterns made of a conductive material,
   wherein the first switching elements and the second switching elements are provided in the circuit board so that a circuit conductor layer of the circuit conductor layers is sandwiched from both sides in the stacking direction between all of the first switching elements and all of the second switching elements so that heat from each of the first switching elements dissipates through the circuit conductor layer and heat from each of the second switching elements also dissipates through the circuit conductor layer,
   wherein a region in which the first switching elements are positioned and a region in which the second switching elements are positioned overlap each other in a stacking direction,
   wherein a lead-out portion is formed at the circuit pattern of the circuit conductor layer interposed between the first switching elements and the second switching elements, and
   wherein the lead-out portion extending from the circuit board in a direction orthogonal to the stacking direction, and being connected to the heat-dissipating unit so that heat is transferred to the heat-dissipating unit.

2. The drive circuit device according to claim 1, wherein the first switching elements and the second switching elements are embedded in the circuit board, and
   the heat-dissipating units are connected to the circuit board so that the circuit board is sandwiched from both sides in the stacking direction between the heat-dissipating units and heat is transferred to the heat-dissipating units.

3. The drive circuit device according to claim 1, wherein the circuit conductor layers comprises a first conductor layer, a second conductor layer, a third conductor layer, and a fourth conductor layer, and
   wherein the insulating layers comprise a first insulating layer interposed between the first conductor layer and second conductor layer, a second insulating layer interposed between the second conductor layer and third conductor layer, and a third insulating layer interposed between the third conductor layer and fourth conductor layer.

4. The drive circuit device according to claim 3, wherein the first and fourth conductor layers are in thermal communication with the heat-dissipating unit to dissipate heat from the first and fourth conductor layers to the heat-dissipating unit.

5. The drive circuit device according to claim 1, wherein the circuit patterns are different between each of the conductive layers.

6. The drive circuit device according to claim 1, wherein the lead-out portion extends toward two or more extension portions, formed at the heat-dissipating unit, from the circuit board in a direction orthogonal to the stacking direction beyond an edge portion of the circuit board, wherein the two or more extension portions extend toward the lead-out portion side connects the lead-out portion to the heat-dissipating unit so that heat is transferred from the lead-out portion to the heat-dissipating unit.

* * * * *